United States Patent
Lake et al.

(10) Patent No.: US 8,653,816 B2
(45) Date of Patent: Feb. 18, 2014

(54) PHYSICAL MOTION INFORMATION CAPTURING OF A SUBJECT DURING MAGNETIC RESONCE IMAGING AUTOMATICALLY MOTION CORRECTED BY THE MAGNETIC RESONANCE SYSTEM

(75) Inventors: David S. Lake, Rochester, MN (US); Armando Manduca, Rochester, MN (US); Jeffrey S. McAllister, St. Paul, MN (US); Nelson Ramirez, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 635 days.

(21) Appl. No.: 12/612,172

(22) Filed: Nov. 4, 2009

(65) Prior Publication Data

US 2011/0101978 A1    May 5, 2011

(51) Int. Cl.
*G01R 33/565* (2006.01)

(52) U.S. Cl.
USPC ............ 324/309; 324/310; 600/410; 382/128

(58) Field of Classification Search
USPC .................... 324/300–322; 600/407–435; 382/128–131
See application file for complete search history.

(56) References Cited

U.S. PATENT DOCUMENTS

| | | | | |
|---|---|---|---|---|
| 5,262,725 A * | 11/1993 | Cuppen et al. | ................. | 324/312 |
| 6,057,685 A * | 5/2000 | Zhou | ............................. | 324/306 |
| 6,073,041 A * | 6/2000 | Hu et al. | ........................ | 600/410 |
| 6,265,873 B1 * | 7/2001 | Le Roux | ........................ | 324/309 |
| 6,275,037 B1 * | 8/2001 | Harvey et al. | ................. | 324/309 |
| 6,307,369 B1 * | 10/2001 | Felmlee et al. | ............... | 324/309 |
| 6,369,568 B1 * | 4/2002 | Ma et al. | ........................ | 324/309 |
| 6,380,740 B1 * | 4/2002 | Laub | ............................ | 324/309 |
| 6,420,870 B1 * | 7/2002 | Kiefer | ........................... | 324/307 |
| 6,469,505 B1 * | 10/2002 | Maier et al. | .................... | 324/309 |
| 6,600,944 B2 * | 7/2003 | Van Den Brink | ............. | 600/410 |
| 6,700,374 B1 * | 3/2004 | Wu et al. | ........................ | 324/312 |
| 7,245,125 B2 * | 7/2007 | Harer et al. | .................... | 324/310 |
| 7,358,732 B2 * | 4/2008 | Van Der Kouwe et al. | ... | 324/309 |
| 7,429,862 B2 * | 9/2008 | Kholmovski et al. | ......... | 324/310 |
| 7,457,655 B2 * | 11/2008 | Welch et al. | .................. | 600/407 |
| 7,479,782 B2 * | 1/2009 | Van Den Brink | ............. | 324/307 |
| 7,495,437 B2 * | 2/2009 | Griswold et al. | ............. | 324/307 |
| 7,511,489 B2 * | 3/2009 | Fautz et al. | .................... | 324/307 |
| 7,643,864 B2 * | 1/2010 | Elgort et al. | .................... | 600/410 |
| 7,864,999 B2 * | 1/2011 | Chang et al. | .................. | 382/128 |
| 7,999,544 B2 * | 8/2011 | Doyle | ........................... | 324/309 |
| 8,103,068 B2 * | 1/2012 | Zabih et al. | .................... | 382/128 |
| 8,131,048 B2 * | 3/2012 | Li et al. | ......................... | 382/131 |
| 8,155,389 B2 * | 4/2012 | Parker et al. | ................... | 382/107 |
| 8,195,417 B2 * | 6/2012 | Feiweier et al. | ................ | 702/95 |
| 8,345,945 B2 * | 1/2013 | Song et al. | .................... | 382/131 |
| 8,396,267 B2 * | 3/2013 | Lake et al. | .................... | 382/128 |
| 2005/0054910 A1 * | 3/2005 | Tremblay et al. | ............. | 600/411 |

(Continued)

*Primary Examiner* — Melissa Koval
*Assistant Examiner* — Tiffany Fetzner
(74) *Attorney, Agent, or Firm* — Patterson & Sheridan LLP

(57) ABSTRACT

Systems, methods and articles of manufacture are disclosed for compensating for motion of a subject during an MRI scan of the subject. k-space data may be received from the MRI scan of the subject. Motion information may be received for the subject. Based on the received motion information, a translational motion of the subject may be determined between a first point in time and a second point in time. A search space for motion correction may be reduced using the determined change and an error margin of the capturing technique. A motion-compensated, graphical image of the subject may be generated using the reduced search space.

24 Claims, 10 Drawing Sheets

(56) References Cited

U.S. PATENT DOCUMENTS

| | | |
|---|---|---|
| 2006/0050981 A1* | 3/2006 | Huang .......................... 382/254 |
| 2006/0079754 A1* | 4/2006 | Welch et al. .................. 600/410 |
| 2006/0224062 A1* | 10/2006 | Aggarwal et al. ............. 600/413 |
| 2007/0090837 A1* | 4/2007 | Van Der Kouwe et al. ... 324/307 |
| 2007/0110290 A1* | 5/2007 | Chang et al. .................. 382/128 |
| 2008/0080775 A1* | 4/2008 | Zabih et al. ................... 382/226 |
| 2008/0205730 A1* | 8/2008 | Stehning et al. ............... 382/131 |
| 2009/0037130 A1* | 2/2009 | Feiweier et al. ............... 702/104 |
| 2009/0087057 A1* | 4/2009 | Parker et al. .................. 382/131 |
| 2009/0169084 A1* | 7/2009 | Li et al. ......................... 382/131 |
| 2009/0177076 A1* | 7/2009 | Aldefeld et al. ............... 600/410 |
| 2009/0285463 A1* | 11/2009 | Otazo et al. ................... 382/131 |
| 2009/0316971 A1* | 12/2009 | Song et al. .................... 382/131 |
| 2010/0076301 A1* | 3/2010 | Elgort et al. ................... 600/411 |
| 2010/0194389 A1* | 8/2010 | Sutton ........................... 324/309 |
| 2010/0194390 A1* | 8/2010 | Kannengiesser et al. ..... 324/309 |
| 2010/0290683 A1* | 11/2010 | Demeester et al. ............ 382/131 |
| 2011/0101978 A1* | 5/2011 | Lake et al. ..................... 324/309 |
| 2011/0105882 A1* | 5/2011 | Lake et al. ..................... 600/410 |
| 2012/0002858 A1* | 1/2012 | Huang et al. .................. 382/131 |

* cited by examiner

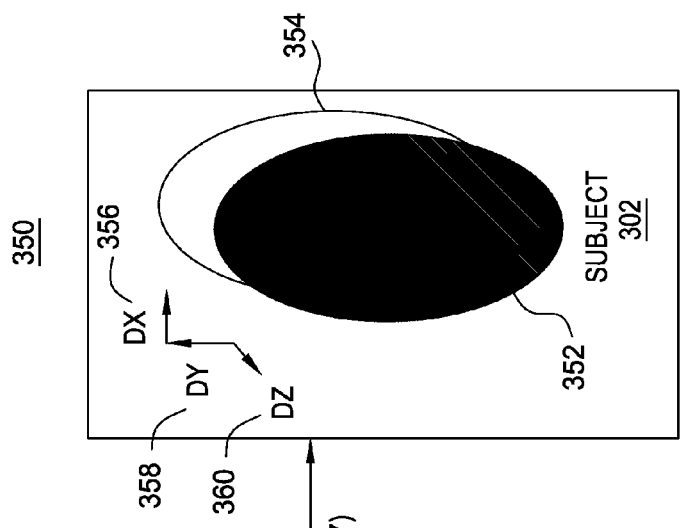
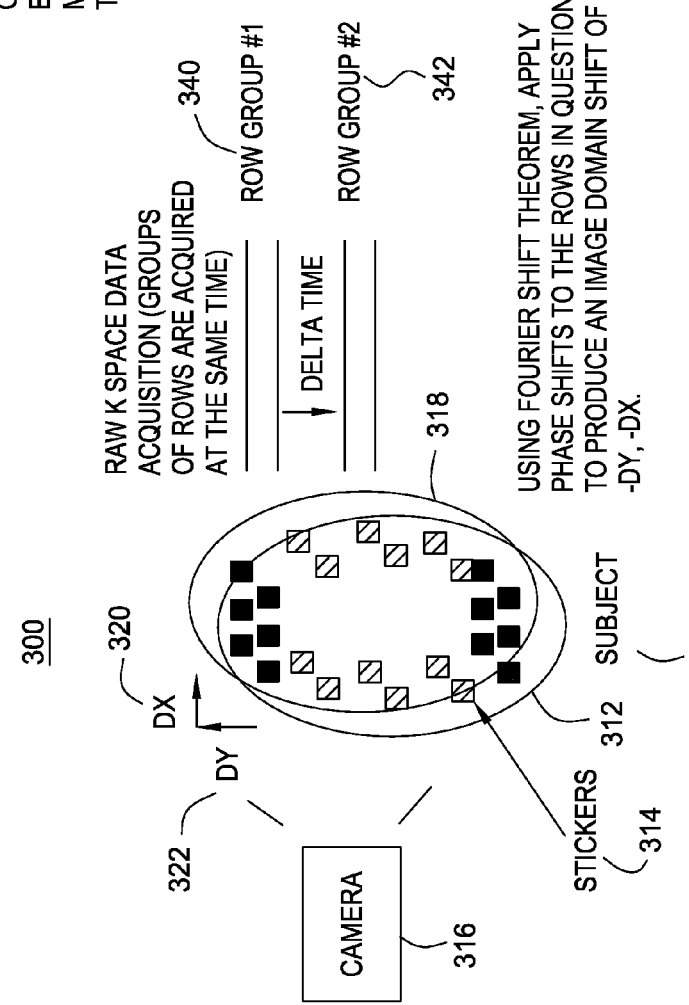
FIG. 3B
FIG. 3A

800

WHERE THE SEARCH SPACE, PRIOR TO BEING REDUCED, INCLUDES A SET OF ALL POTENTIALLY OCCURRING PHYSICAL MOTIONS OF THE SUBJECT BETWEEN THE FIRST AND SECOND POINTS IN TIME, WHERE THE ERROR MARGIN IS SPECIFIC TO THE CAPTURING TECHNIQUE, WHERE AT LEAST ONE PHYSICAL MOTION IN THE SET OF ALL POTENTIALLY OCCURRING PHYSICAL MOTIONS IS NOT INCLUDED IN THE SET OF CANDIDATE PHYSICAL MOTIONS;
WHERE THE PLURALITY OF ROWS OF THE K-SPACE DATA FURTHER INCLUDES A THIRD ROW OF DATA ACQUIRED AT A THIRD POINT IN TIME DURING THE MRI SCAN, WHERE THE FIRST, SECOND, AND THIRD POINTS IN TIME ARE DISTINCT, WHERE THE METHOD FURTHER INCLUDES: (I) DETERMINING A SECOND PHYSICAL TRANSLATIONAL MOTION OF THE SUBJECT BETWEEN THE SECOND POINT IN TIME AND THE THIRD POINT IN TIME , BASED ON THE RECEIVED PHYSICAL MOTION INFORMATION, WHERE THE SECOND PHYSICAL TRANSLATIONAL MOTION IS DIFFERENT FROM THE FIRST PHYSICAL TRANSLATIONAL MOTION, WHERE AT LEAST THE THIRD ROW OF THE FREQUENCY DOMAIN DATA VALUES IS MODIFIED IN ORDER TO COMPENSATE FOR THE SECOND PHYSICAL TRANSLATIONAL MOTION, WHERE THE THIRD ROW OF THE FREQUENCY DOMAIN DATA VALUES OF THE K-SPACE DATA IS MODIFIED DIFFERENTLY THAN THE SECOND ROW OF THE FREQUENCY DOMAIN DATA VALUES;
WHERE THE PHYSICAL MOTION IS COMPENSATED FOR BY A MOTION CORRECTION APPLICATION, WHERE THE MOTION CORRECTION APPLICATION INCLUDES: (I) A K-SPACE MANAGER COMPONENT; (II) A MOTION MANAGER COMPONENT; (III) AN INTERVAL MANAGER COMPONENT; (IV) A K-SPACE MODIFIER COMPONENT; (V) AN IMAGE GENERATOR COMPONENT; AND (VI) AN IMAGE EVALUATOR COMPONENT; WHERE THE K-SPACE MANAGER COMPONENT IS CONFIGURED TO RECEIVE THE K-SPACE DATA FROM THE MRI SCAN OF THE SUBJECT;
WHERE THE MOTION MANAGER COMPONENT IS CONFIGURED TO: (I) RECEIVE THE PHYSICAL MOTION INFORMATION AND (II) DETERMINE THE FIRST PHYSICAL TRANSLATIONAL MOTION OF THE SUBJECT BETWEEN THE FIRST AND SECOND POINTS IN TIME;
WHERE THE INTERVAL MANAGER COMPONENT IS CONFIGURED TO SYNCHRONIZE THE PHYSICAL MOTION INFORMATION AND THE K-SPACE DATA

WHERE THE K-SPACE MODIFIER COMPONENT IS CONFIGURED TO MULTIPLY AT LEAST ONE DATA ELEMENT IN THE K-SPACE DATA BY A COMPLEX NUMBER IN ORDER TO ALTER AT LEAST ONE OF A PHASE AND AN AMPLITUDE OF THE AT LEAST ONE DATA ELEMENT; WHERE THE IMAGE GENERATOR COMPONENT IS CONFIGURED TO GENERATE GRAPHICAL IMAGES BASED ON THE K-SPACE DATA; WHERE THE IMAGE EVALUATOR COMPONENT IS CONFIGURED TO PROGRAMMATICALLY EVALUATE GENERATED GRAPHICAL IMAGES BASED ON A SET OF PREDEFINED CRITERIA, WHERE THE SET OF PREDEFINED CRITERIA INCLUDES THE PREDEFINED IMAGE SHARPNESS CRITERION;

WHERE MODIFYING THE RECEIVED K-SPACE DATA BASED ON THE REDUCED SEARCH SPACE INCLUDES, FOR EACH PHYSICAL MOTION FALLING WITHIN THE ERROR MARGIN OF THE FIRST PHYSICAL TRANSLATIONAL MOTION: (I) MODIFYING AT LEAST THE SECOND ROW OF THE FREQUENCY DOMAIN DATA VALUES IN ORDER TO COMPENSATE FOR THE RESPECTIVE PHYSICAL MOTION; (II) GENERATING A CANDIDATE GRAPHICAL IMAGE OF THE SUBJECT BASED ON THE MODIFIED K-SPACE DATA; (III) PROGRAMMATICALLY EVALUATING SHARPNESS OF THE CANDIDATE GRAPHICAL IMAGE BASED ON THE PREDEFINED IMAGE SHARPNESS CRITERION; AND (IV) DETERMINING WHETHER TO ACCEPT THE MODIFIED K-SPACE DATA BASED ON THE EVALUATION;

WHERE THE MODIFIED K-SPACE DATA IS ACCEPTED FOR ONLY ONE PHYSICAL MOTION FALLING WITHIN THE ERROR MARGIN OF THE FIRST PHYSICAL TRANSLATIONAL MOTION, THE ONE PHYSICAL MOTION HAVING A CORRESPONDING CANDIDATE GRAPHICAL IMAGE HAVING A HIGHEST MEASURE OF SHARPNESS AMONG THE CANDIDATE GRAPHICAL IMAGES FOR THE CANDIDATE MOTIONS, WHERE ONLY ONE MODIFICATION IS ACCEPTED FOR EACH OF THE FIRST AND SECOND PHYSICAL TRANSLATIONAL MOTIONS;

WHERE MODIFYING AT LEAST THE SECOND ROW OF THE FREQUENCY DOMAIN DATA VALUES OF THE K-SPACE DATA INCLUDES: (I) DETERMINING A CORRESPONDING CHANGE TO A VALUE IN THE K-SPACE DATA IN ORDER TO COMPENSATE FOR THE RESPECTIVE PHYSICAL MOTION, WHERE THE VALUE IS A PHASE OF A SINUSOID IN THE FREQUENCY DOMAIN REPRESENTATION; AND (II) MODIFYING AT LEAST THE SECOND ROW OF THE FREQUENCY DOMAIN DATA VALUES BASED ON THE DETERMINED CHANGE IN ORDER TO SHIFT AN IMAGE CORRESPONDING TO THE FIRST ROW OF THE FREQUENCY DOMAIN DATA VALUES TOWARDS AN IMAGE CORRESPONDING TO THE SECOND ROW OF THE FREQUENCY DOMAIN DATA VALUES

WHERE GENERATING A GRAPHICAL IMAGE OF THE SUBJECT INCLUDES PERFORMING A TWO-DIMENSIONAL FAST FOURIER TRANSFORM ON THE K-SPACE DATA, WHERE THE CORRESPONDING CHANGE IS DETERMINED USING THE FOURIER SHIFT THEOREM, WHERE MODFIYING AT LEAST THE SECOND ROW OF THE FREQUENCY DOMAIN DATA VALUES INCLUDES MULTIPLYING A DATA ELEMENT IN THE K-SPACE DATA, COMPRISING A FIRST COMPLEX NUMBER, BY A SECOND COMPLEX NUMBER IN ORDER TO ALTER AT LEAST ONE OF A PHASE AND AN AMPLITUDE OF THE DATA ELEMENT IN THE K-SPACE DATA;

WHERE THE MOTION CORRECTION APPLICATION IS CONFIGURED TO REDUCE THE SEARCH SPACE FOR MOTION CORRECTION USING, IN RESPECTIVE INSTANCES, EACH OF A PLURALITY OF DISTINCT CAPTURING TECHNIQUES INCLUDING: (I) A CAMERA-BASED APPROACH; (II) A PERIODICALLY ROTATED OVERLAPPING PARALLEL LINES WITH ENHANCED RECONSTRUCTION (PROPELLER) APPROACH; AND (III) AN OPTICAL-FIBER-BASED APPROACH;

WHERE THE CAMERA-BASED APPROACH IS ASSOCIATED WITH A FIRST ERROR MARGIN, WHERE THE PROPELLER APPROACH IS ASSOCIATED WITH A SECOND ERROR MARGIN, WHERE THE CAMERA-BASED APPROACH IS ASSOCIATED WITH A THIRD ERROR MARGIN, WHERE EACH OF THE FIRST, SECOND, AND THIRD ERROR MARGINS IS DISTINCT, WHERE THE MOTION CORRECTION APPLICATION IS CONFIGURED TO REDUCE THE SEARCH SPACE FOR MOTION CORRECTION USING THE RESPECTIVE ERROR MARGIN SPECIFIC TO EACH OF THE PLURALITY OF DISTINCT CAPTURING TECHNIQUES

PHYSICAL MOTION INFORMATION CAPTURING OF A SUBJECT DURING MAGNETIC RESONCE IMAGING AUTOMATICALLY MOTION CORRECTED BY THE MAGNETIC RESONANCE SYSTEM

STATEMENT REGARDING FEDERALLY SPONSORED RESEARCH OR DEVELOPMENT

This invention was made with government support under EB000229 awarded by the National Institute of Biomedical Imaging and Bioengineering. The government has certain rights in the invention.

BACKGROUND OF THE INVENTION

1. Field of the Invention

Embodiments of the invention relate to motion correction. More specifically, embodiments of the invention relate to motion correction in a magnetic resonance imaging (MRI) environment.

2. Description of the Related Art

Motion correction refers to a post-processing approach for compensating for patient motion during an MRI scan. However, a post-processing approach may not take into account any physical measurements of patient motion. Without the aid of the physical measurements, the search space of possible patient motion may be too large to be searched completely. Further, post-processing approaches may erroneously compensate for incorrect motion that nevertheless results in a sharper graphical image.

SUMMARY OF THE INVENTION

One embodiment of the invention includes a method for compensating for motion of a subject during a magnetic resonance imaging (MRI) scan of the subject, the method including configuring one or more processors to perform an operation. The operation may generally include receiving k-space data from the MRI scan of the subject, wherein the k-space data comprises frequency domain data for generating a graphical image of the subject, and wherein the frequency domain data includes a plurality of rows including a first row of data acquired at a first point in time during the MRI scan and a second row of data acquired at a second point in time during the MRI scan; receiving motion information captured for the subject by a capturing technique during the MRI scan; determining a translational motion of the subject between the first point in time and the second point in time based on the received motion information; and reducing a search space for motion correction using the determined translational motion, wherein the search space includes a set of potentially occurring motions of the subject between the first point in time and the second point in time.

Another embodiment of the invention includes a computer-readable storage medium containing a program, which when executed by the processor is configured to perform an operation for compensating for motion of a subject during a magnetic resonance imaging (MRI) scan of the subject. The operation may generally include receiving k-space data from the MRI scan of the subject, wherein the k-space data comprises frequency domain data for generating a graphical image of the subject, and wherein the frequency domain data includes a plurality of rows including a first row of data acquired at a first point in time during the MRI scan and a second row of data acquired at a second point in time during the MRI scan; receiving motion information captured for the subject by a capturing technique during the MRI scan; determining a translational motion of the subject between the first point in time and the second point in time based on the received motion information; and reducing a search space for motion correction using the determined translational motion, wherein the search space includes a set of potentially occurring motions of the subject between the first point in time and the second point in time.

Still another embodiment of the invention includes a system having a processor and a memory containing a program, which when executed by the processor is configured to perform an operation for compensating for motion of a subject during a magnetic resonance imaging (MRI) scan of the subject. The operation may generally include receiving k-space data from the MRI scan of the subject, wherein the k-space data comprises frequency domain data for generating a graphical image of the subject, and wherein the frequency domain data includes a plurality of rows including a first row of data acquired at a first point in time during the MRI scan and a second row of data acquired at a second point in time during the MRI scan; receiving motion information captured for the subject by a capturing technique during the MRI scan; determining a translational motion of the subject between the first point in time and the second point in time based on the received motion information; and reducing a search space for motion correction using the determined translational motion, wherein the search space includes a set of potentially occurring motions of the subject between the first point in time and the second point in time.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIGS. 3A-3B illustrate examples of motion information capture in an MRI environment, according to one embodiment of the invention.

FIG. 8 depicts additional aspects of physical motion compensation, according to one embodiment of the invention.

FIG. 9 depicts additional aspects of physical motion compensation, according to one embodiment of the invention.

FIG. 10 depicts additional aspects of physical motion compensation, according to one embodiment of the invention.

DETAILED DESCRIPTION OF THE PREFERRED EMBODIMENTS

Figure 1:
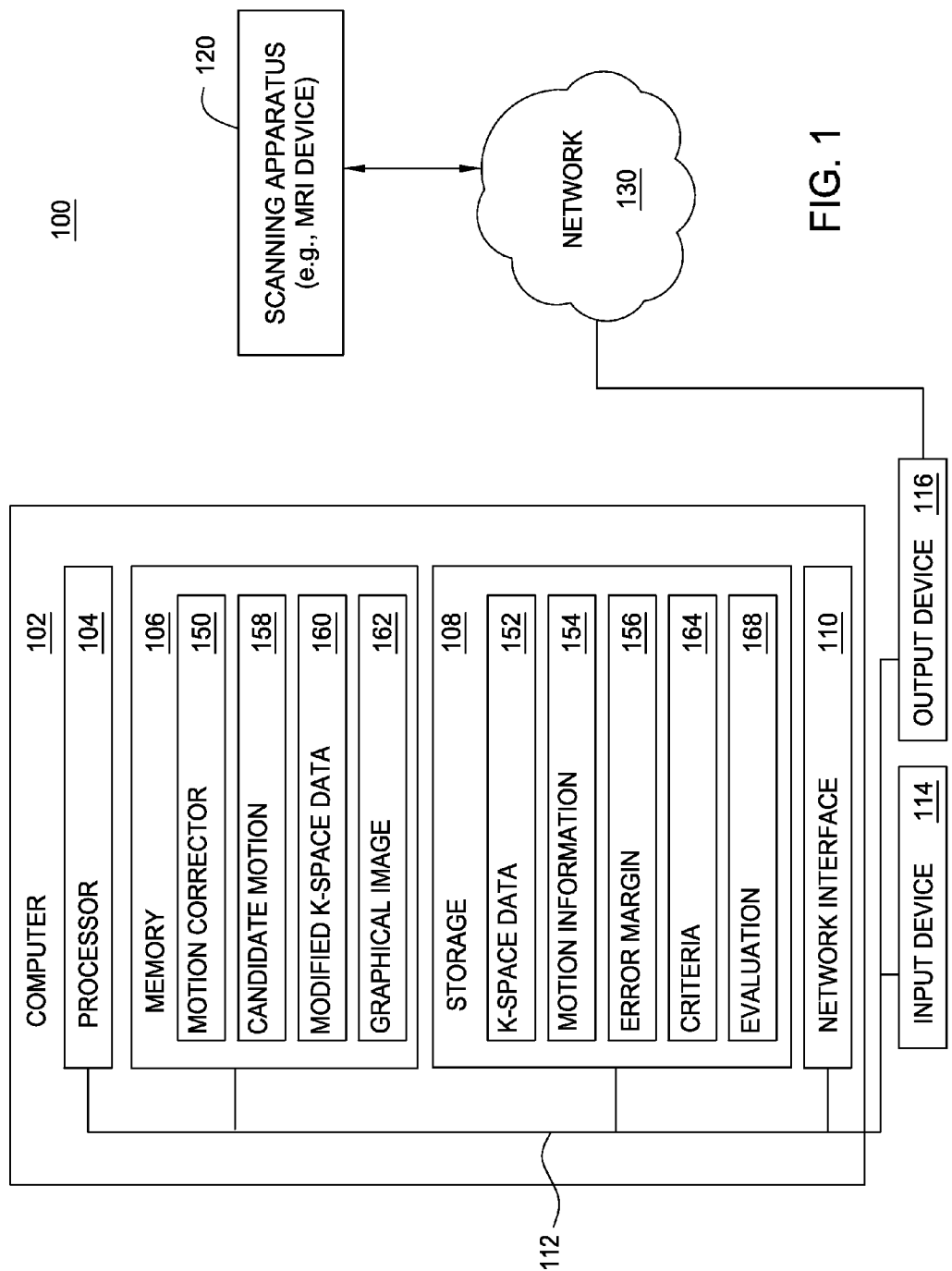
FIG. 1 is a block diagram illustrating a system for compensating for motion of a subject during an MRI scan of the subject, according to one embodiment of the invention.

Embodiments of the present invention generally compensate for physical motion by a subject during an MRI scan of the subject. As used herein, physical motion is also referred to as motion. A subject refers to any living organism or animal to which medical imaging technology may be applied. One embodiment of the invention provides a motion corrector. The motion corrector may determine a translational motion of the subject between a first point in time during the MRI scan and a second point in time during the MRI scan. Further, the motion corrector may reduce a search space for motion correction using the determined change. The search space for motion correction between the first point in time and the second point in time is a set of all possible patient motions that may have occurred between the first point in time and the second point in time. The motion corrector may use the reduced search space to generate graphical images from k-space (obtained from the MRI scan) data more efficiently and more accurately. k-space refers to a temporary image space (not to be confused with an image space corresponding to a graphical image) in which data from digitized magnetic resonance (MR) signals (e.g., frequency domain data) may be stored during data acquisition (i.e., during an MRI scan). When k-space is full (i.e., when the MRI scan is complete), the k-space data may be processed (e.g., via a discrete Fourier transform (DFT)) to produce a final image. Thus, k-space holds raw data from an MRI scan prior to image construction.

Further, embodiments of the present invention operate in conjunction with techniques for capturing motion information. During an MRI scan, motion information may be captured for a subject of the scan. For example, the movement of a patient's head during an MRI brain scan may degrade image quality of the scan. The techniques for capturing motion information may be used to correct movement such as this head motion of the patient.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

One embodiment of the invention is implemented as a program product for use with a computer system. The program(s) of the program product defines functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive) on which information is permanently stored; (ii) writable storage media (e.g., floppy disks within a diskette drive or hard-disk drive) on which alterable information is stored. Such computer-readable storage media, when carrying computer-readable instructions that direct the functions of the present invention, are embodiments of the present invention. Other media include communications media through which information is conveyed to a computer, such as through a computer or telephone network, including wireless communications networks. The latter embodiment specifically includes transmitting information to/from the Internet and other networks. Such communication media, when carrying computer-readable instructions that direct the functions of the present invention, are embodiments of the present invention. Broadly, computer-readable storage media and communications media may be referred to herein as computer-readable media.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

FIG. 1 is a block diagram illustrating a system 100 for compensating for motion of a subject during an MRI scan, according to one embodiment of the invention. The networked system 100 includes a computer 102. The computer 102 may be connected to other computers via a network 130. In general, the network 130 may be a telecommunications network and/or a wide area network (WAN). In a particular embodiment, the network 130 is the Internet.

The computer 102 generally includes a processor 104 connected via a bus 112 to a memory 106, a network interface device 110, a storage 108, an input device 114, and an output device 116. The computer 102 is generally under the control of an operating system (not shown). Examples of operating systems include UNIX, versions of the Microsoft Windows® operating system, and distributions of the Linux® operating system. (Note: Linux is at trademark of Linus Torvalds in the United States and other countries.) More generally, any operating system supporting the functions disclosed herein may be used. The processor 104 is included to be representative of a single CPU, multiple CPUs, a single CPU having multiple processing cores, and the like. Similarly, the memory 106 may be a random access memory. While the memory 106 is shown as a single entity, it should be understood that the memory 106 may comprise a plurality of modules, and that the memory 106 may exist at multiple levels, from high speed registers and caches to lower speed but larger DRAM chips. The network interface device 110 may be any type of network communications device allowing the computer 102 to communicate with other computers via the network 130.

The storage 108 may be a hard disk drive storage device. Although the storage 108 is shown as a single unit, the storage 108 may be a combination of fixed and/or removable storage devices, such as fixed disc drives, floppy disc drives, tape drives, removable memory cards, or optical storage. The memory 106 and the storage 108 may be part of one virtual address space spanning multiple primary and secondary storage devices.

The input device 114 may be any device for providing input to the computer 102. For example, a keyboard, keypad, light pen, touch-screen, track-ball, or speech recognition unit, audio/video player, and the like may be used. The output device 116 may be any device for providing output to a user of the computer 102. For example, the output device 116 may be any conventional display screen or set of speakers, along with their respective interface cards, i.e., video cards and sound cards (not shown). Although shown separately from the input device 114, the output device 116 and input device 114 may be combined. For example, a display screen with an integrated touch-screen, a display with an integrated keyboard, or a speech recognition unit combined with a text speech converter may be used.

Additionally, FIG. 1 shows a scanning apparatus 120 connected to the network 130. The scanning apparatus 120 is included to be representative of imaging systems used to scan a subject and produce an image of the subject from the scan. For example, as described in greater detail below, scanning apparatus 120 may be a magnetic resonance imaging (MRI) device. However, one of ordinary skill in the art will recognize that embodiments of the invention may be adapted for use with image data captured using a variety of imaging techniques.

As shown, the memory 106 of the computer 102 includes a motion corrector 150, a candidate motion 158, modified k-space data 160, and a graphical image 162. Further, the storage 108 of the computer 102 includes k-space data 152, motion information 154, an error margin 156, criteria 164, and an evaluation 168. FIGS. 2 through 6 and associated descriptions detail the structure and operation of the motion corrector 150 running on the computer 102.

Figure 2:
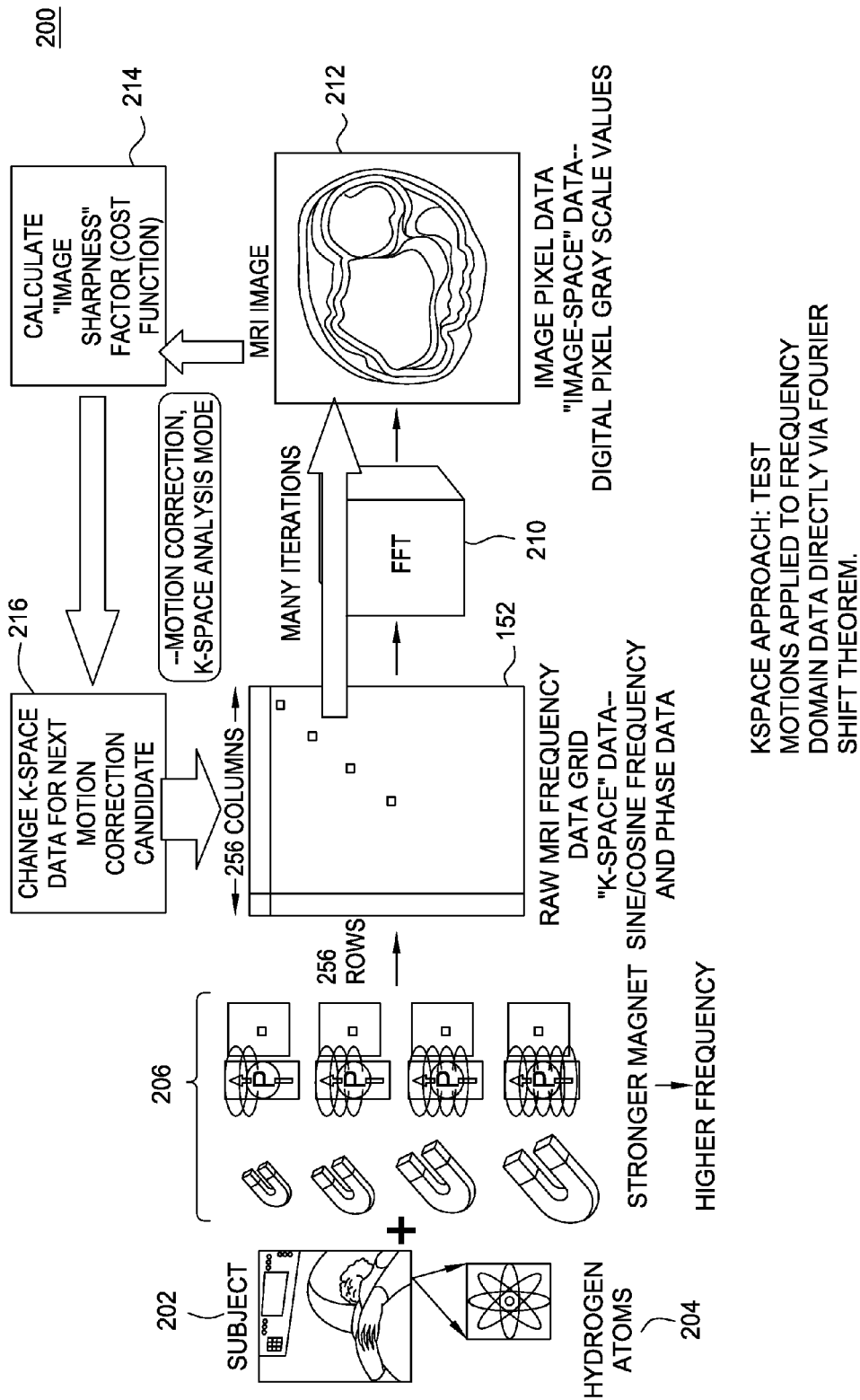
FIG. 2 is a data flow diagram illustrating motion correction in an MRI environment, according to one embodiment of the invention.

FIG. 2 is a data flow diagram 200 illustrating motion correction in an MRI environment, according to one embodiment of the invention. As shown, the data flow diagram 200 includes a subject 202, hydrogen atoms 204 of the subject 202, and magnets 206. Further, the data flow diagram 200 includes k-space data 152, fast Fourier transform operations 210, MRI image 212 (also referred to herein as image space data, i-space data, and graphical image), operations 214 to evaluate the MRI image 212, and operations 216 to consider the next candidate motion 158.

Magnetic resonance imaging, or MRI, exploits magnetic properties of a hydrogen atom 204 to generate an image of the interior of a subject 202 (such as of a human body). MRI is a medical diagnostic technique that involves exposing a subject 202, such as a person, to a magnetic field of known strength (e.g., from a magnet 206). Hydrogen atoms 204 in the subject 202 may have a resonant frequency proportional to the magnetic field 206. Because different parts of a subject (such as tissues of a human body) may have different hydrogen atom densities, hydrogen atom densities at different positions inside the subject may be measured to generate a graphical image 212.

In one embodiment, MRI image data may be acquired in the form of frequency domain data 152, from which the graphical image 212 may be generated. For example, the frequency data 152 may include a 256×256 matrix of complex numbers. Each complex number may describe an amplitude and a phase of a component sinusoid, for a total of 65,536 (i.e., 256 times 256) component sinusoids. The component sinusoids may be superimposed (e.g., via fast Fourier transform operations 210) to generate the image 212.

The motion corrector 150 may modify the k-space data (e.g., via the Fourier shift theorem) to compensate for subject motion, according to one embodiment. In addition, the motion corrector 150 may perform operations 214 to evaluate a generated image 212 (i.e., from modified k-space data). The motion corrector 150 may also perform operations 216 to consider a next candidate motion 158. The operations of the motion corrector 150 are further described below in conjunction with FIGS. 4 through 6.

In one embodiment, the motion corrector 150 receives motion information 154. The motion information 154 may be captured by various techniques (e.g., camera-based approaches, optical-fiber-based approaches, and periodically rotated overlapping parallel lines with enhanced reconstruction (PROPELLER), etc.). In one embodiment, multiple techniques for capturing motion information may also be combined. FIGS. 3A-3B show examples of capturing motion information in an MRI environment, using a camera-based approach 300 of FIG. 3A and an optical-fiber-based approach 350 of FIG. 3B, according to one embodiment of the invention.

As shown in FIG. 3A, the camera-based approach 300 includes a camera 316 and stickers 314 detectable by the camera 316 and affixed to a subject 302. Suppose that during an MRI scan, the subject 302 moves from a first position 312 to a second position 318. The camera may capture a corresponding movement of the stickers 314. The captured movement may be processed to determine a corresponding translation on a two-dimensional plane. For example, the translation may include a distance 320 along a direction of the x-axis of the two-dimensional plane (also referred to herein as a delta x) and a distance 322 along a direction of the y-axis of the two-dimensional plane (also referred to herein as a delta y).

In one embodiment, the optical-fiber-based approach 350 of FIG. 3B, a plurality of emitters is configured to emit different frequencies of light from different locations in the MRI environment. One or more detectors of the light are affixed (directly or indirectly) to the subject 302. Each emitter and detector may be an open end of an optical fiber cable. Suppose that during an MRI scan, the subject 302 moves from a first position 352 to a second position 354. Subject movement may be determined by analyzing changes in the composition of light detected at the one or more detectors. For example, Fourier signal decomposition may be applied to the received light to produce a frequency spectrum. The produced frequency spectrum may then be triangulated to determine subject movement. Further, the optical-fiber-based approach 350 may determine subject movement in three dimensions. That is, captured movement may be processed to determine a corresponding translation in a three-dimensional space. For example, the translation may include a distance 356 along a direction of the x-axis, a distance 358 along a direction of the y-axis, and a distance 360 along a direction of the z-axis (or delta z).

In one embodiment, MRI image data may be acquired one or more rows at a time, regardless of how the motion information 154 is obtained (e.g., whether via a camera-based approach, optical-fiber-based approach, etc.). For example, a first three rows 340 of the k-space data 152 may be acquired. A time period (such as several milliseconds, e.g., to allow hydrogen atoms in a high energy state to return to a low energy state) may elapse before a next three rows 342 of the k-space data 152 is acquired. Suppose the subject 302 moves during the time period (i.e., between the respective acquisitions of the first three rows 340 and the next three rows 342). In one embodiment, during post-processing of the k-space data 152, the motion corrector 150 may modify the next three rows 342 (specifically, phase and/or amplitude information in the rows 342) to compensate for the movement. For example, the motion corrector 150 may use the Fourier shift theorem to determine a change in phase (and/or amplitude) to compensate for the movement. In effect, the motion corrector 150 shifts an image corresponding to the first three rows 340 of k-space data towards an image corresponding to the next three rows 342 of k-space data.

Figure 4:
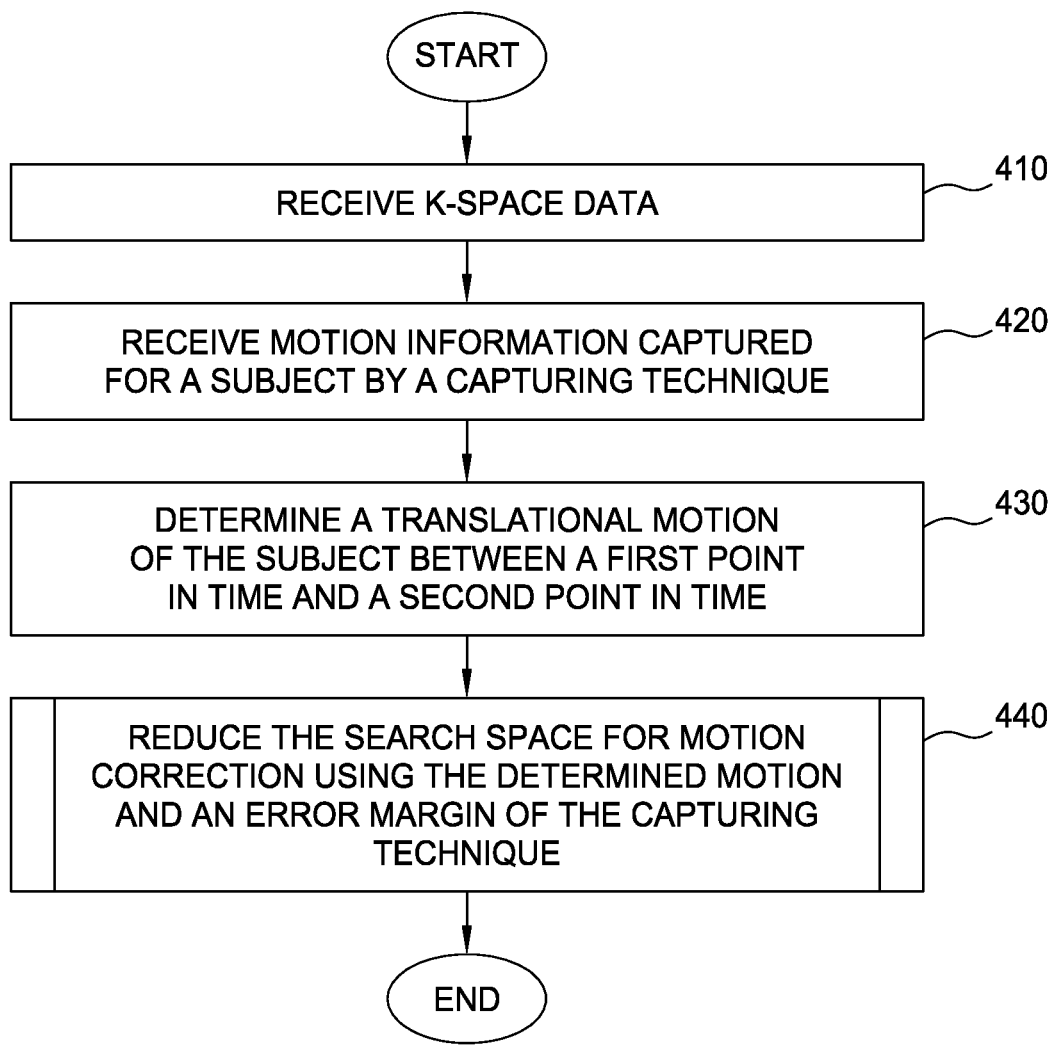
FIG. 4 is a flowchart depicting a method for compensating for motion of a subject during an MRI scan of the subject, according to one embodiment of the invention.

FIG. 4 is a flowchart depicting a method 400 for compensating for motion of a subject during an MRI scan of the subject, according to one embodiment of the invention. The method 400 may be performed by the motion corrector 150 of FIG. 1. As shown, the method 400 begins at step 410, where the motion corrector 150 receives k-space data from the MRI scan of the subject. The k-space data may include frequency domain data, from which a graphical image of the subject may be generated. Data in the frequency domain may be organized in the form of rows. For example, data in the frequency domain may include 256 rows of 256 complex numbers (i.e., a 256×256 matrix), each complex number describing at least a phase and an amplitude of a component sinusoid of the graphical image. Further, the rows may include a first row of data acquired at a first point in time during the MRI scan (e.g., time $t_1=0$ milliseconds) and a second row of data acquired at a second point in time (e.g., time $t_2=1$ millisecond) during the MRI scan.

At step 420, the motion corrector 150 receives motion information 154 captured for the subject by a capturing technique during the MRI scan, according to one embodiment. Examples of capturing techniques include camera-based approaches, optical-fiber-based approaches, and PROPELLER MRI. At step 430, the motion corrector 150 determines a motion (e.g., a translational motion) of the subject between the first point in time (e.g., $t_1$) and the second point in time (e.g., $t_2$), based on the received motion information 154. For example, the motion corrector 150 may identify motion information captured between times $t_1$ and $t_2$ and determine a corresponding motion of the subject (i.e., between times $t_1$ and $t_2$) based on the identified motion information.

At step 440, the motion corrector 150 reduces the search space for motion correction using the determined motion and an error margin 156 of the capturing technique. The search space for motion correction includes a set of all possible patient motions during an MRI scan. Between a first point in time and a second point in time, the search space for motion correction includes a set of all possible patient motions that may have occurred between the first point in time and the second point in time. That is, the determined motion and the error margin 156 may be used to guide motion correction by focusing a search (e.g., sample corrections and subsequent evaluation of image sharpness) on motions falling within the error margin 156 of the determined motion. In other words, the search space may be reduced to only those motions falling within the error margin 156 of the determined motion. Therefore, the search space for motion correction is reduced in size from the original search space, in which every possible motion is considered (as opposed to only those motions falling within the error margin 156 of a determined motion). As a result, the motion corrector 150 may use the reduced search space to generate graphical images from the k-space data more efficiently and more accurately. Reducing the search space for motion correction is further described below in conjunction with FIG. 5. After step 440, the method 400 terminates.

Figure 5:
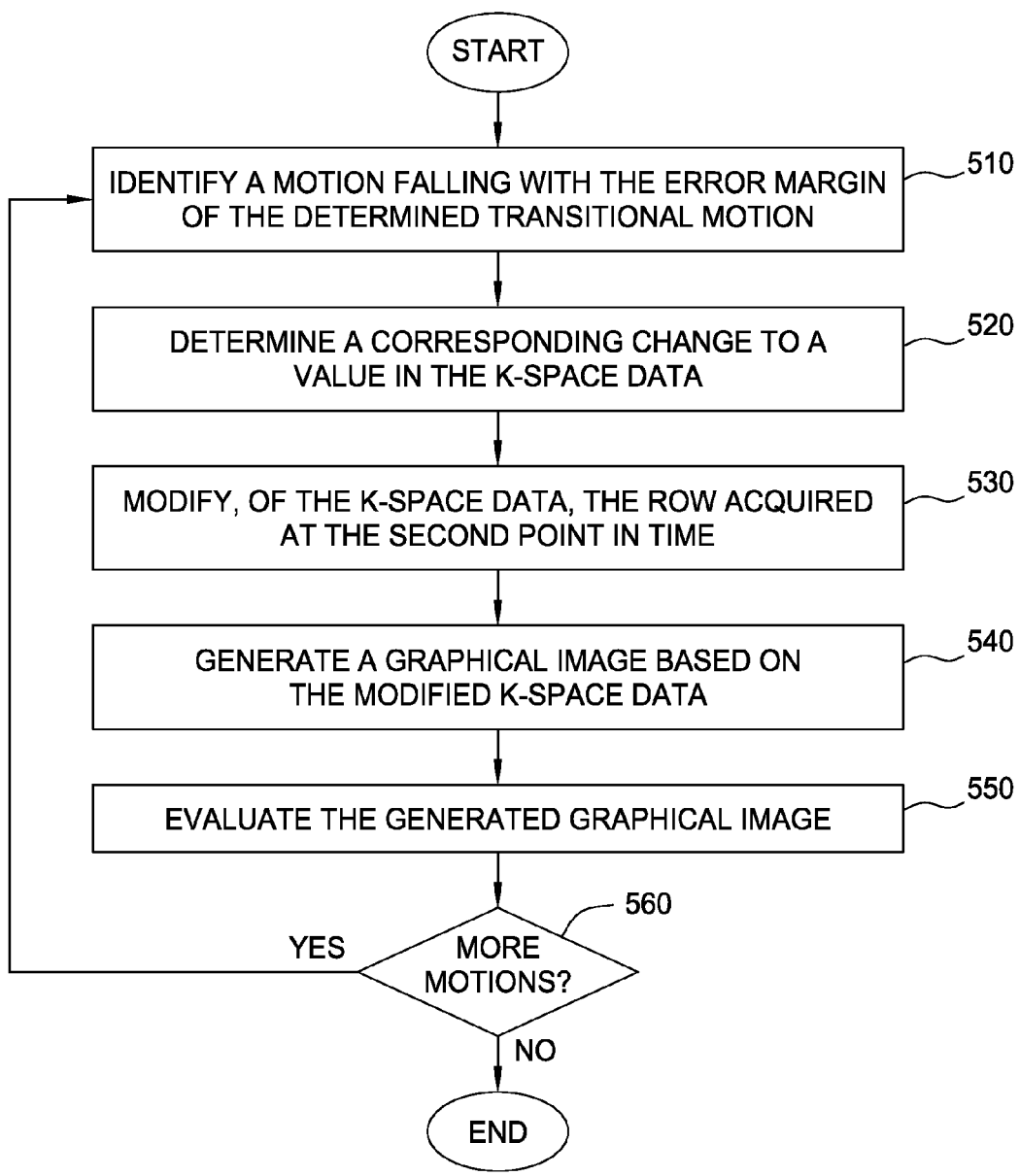
FIG. 5 is a flowchart depicting a method for reducing the search space for motion correction, according to one embodiment of the invention.

FIG. 5 is a flowchart depicting a method 500 for reducing the search space for motion correction, according to one embodiment of the invention. The method 500 may be performed by the motion corrector 150 of FIG. 1. Further, the method 500 corresponds to the step 440 of FIG. 4. As shown, the method 500 begins at step 510, where the motion corrector 150 identifies a motion falling within the error margin of the determined translational motion. The identified motion is also referred to herein as a "candidate motion" 158. For example, suppose that the determined translational motion according to a camera-based approach is one centimeter in the direction of the x-axis. Further, suppose that the error margin 156 of the camera-based approach is (plus or minus) 0.2 centimeters. Assuming that the level of granularity for candidate motions is to the tenth of a centimeter, the motion corrector 150 may identify a candidate motion 158 of 0.8, 0.9, 1.0, 1.1, or 1.2 centimeters in the direction of the x-axis. In one embodiment, the motion corrector 150 identifies and iterates through all of the candidate motions 158. For each candidate motion 158, the motion corrector 150 may perform steps 520 through 550, according to one embodiment.

At step 520, the motion corrector 150 determines a corresponding change to a value in the k-space data 152 to compensate for the candidate motion 158, according to one embodiment. For example, suppose the candidate motion 158 is 0.8 centimeters in the direction of the x-axis, between times $t_1$ and $t_2$. The motion corrector 150 may use the Fourier shift theorem to determine a change to elements of the k-space data acquired at time $t_2$ (i.e., subsequent to the candidate motion). For example, if three rows of data (of the k-space data) were acquired at time $t_2$, the motion corrector 150 may use the Fourier shift theorem to determine a change to elements of the three rows of data that correspond to a translation of 0.8 centimeters in the opposite direction of the x-axis (i.e., to compensate for the candidate motion 158). For instance, the determined change may include multiplying at least one element (e.g., a complex number that describes a component sinusoid of the graphical image 162) of the three rows of data by a complex number to change the phase (and/or amplitude) of the at least one element.

At step 530, the motion corrector 150 modifies the at least one of the elements of the k-space data acquired at time $t_2$ based on the determined change, according to one embodiment. For example, the motion corrector 150 may multiply each element of the three rows of data by the same complex number to change the phase of each component sinusoid represented by the three rows of data. Based on the Fourier shift theorem, the phase changes may correspond to a translation of 0.8 centimeters in the opposite direction of the x-axis in image space (i.e., the time domain representation of the k-space data, e.g., graphical image 162). That is, the phase changes compensate for subject motion of 0.8 centimeters in the direction of the x-axis between times $t_1$ and $t_2$. At step 540, the motion corrector 150 generates a graphical image 162 (e.g., by performing one-dimensional fast Fourier transforms on the rows and columns of the k-space data, respectively) based on the modified k-space data. For example, the graphical image 212 may be generated. At step 550, the motion corrector 150 evaluates the generated graphical image 162 according to criteria 164 (e.g., image sharpness). In one embodiment, the motion corrector 150 may define the criteria 164 based on user input. Based on the evaluation 168 (e.g., whether the image 162 generated from modified k-space data is sharper than an image generated from unmodified k-space data), the motion corrector 150 may accept or reject the candidate motion 158.

At step 560, the motion corrector 150 determines whether more candidate motions 158 remain to be evaluated, according to one embodiment. If so, the method 500 returns to step 510. Otherwise, the method 500 terminates. In one embodiment, the motion corrector 150 evaluates sharpness of images 162 generated from all candidate motions 158 falling within the error margin 156 of the determined motion. The motion corrector 150 may select the sharpest image based on all of the evaluations 168. Further, the motion corrector 150 may iteratively compensate for motions occurring between multiple data acquisitions. For example, the motion corrector 150 may compensate for a first movement of the subject occurring between time $t_1$ and $t_2$, a second movement of the subject occurring between time $t_2$ and $t_3$, etc.

Figure 6:
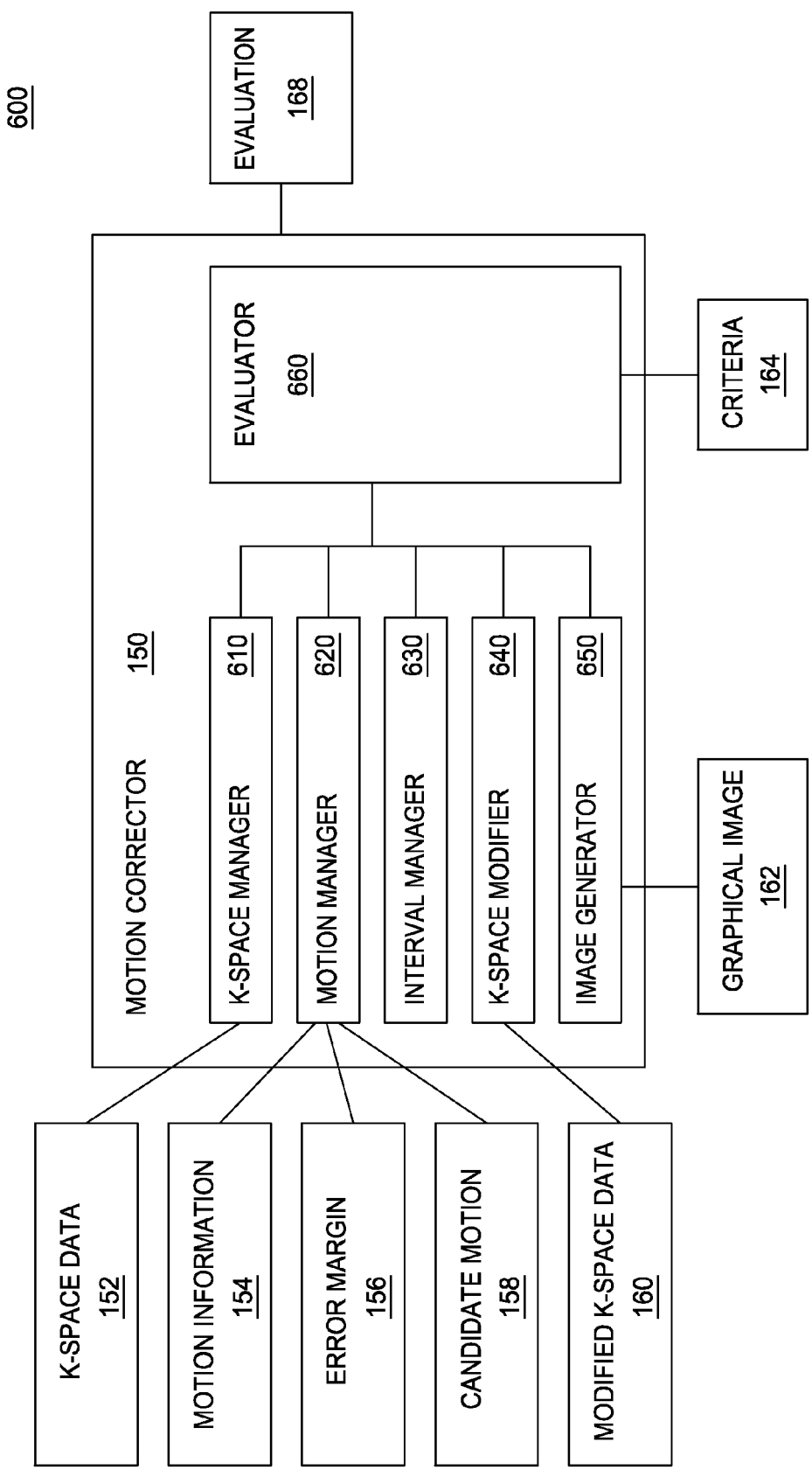
FIG. 6 is a block diagram illustrating components of a motion corrector, according to one embodiment of the invention.

FIG. 6 is a block diagram illustrating components 600 of the motion corrector 150 of FIG. 1, according to one embodiment of the invention. As shown, the motion corrector 150 includes a k-space manager 610, a motion manager 620, an interval manager 630, a k-space modifier 640, an image generator 650, and an evaluator 660.

In one embodiment, the k-space manager 610 receives the k-space data 152. k-space refers to a temporary image space (not to be confused with an image space corresponding to a graphical image) in which data from digitized magnetic resonance (MR) signals may be stored during data acquisition (i.e., during an MRI scan). When k-space is full (i.e., when the MRI scan is complete), the k-space data may be processed to produce a final image. Thus, k-space holds raw data from an MRI scan prior to image construction, according to one embodiment. For example, the k-space data 152 may include frequency domain data, from which the image 212 may be generated. The motion manager 620 receives motion information 154 (e.g., from a camera-based approach), according to one embodiment. Further, the motion manager 620 receives an error margin 156 associated with the motion information 154 (e.g., a measure of average error associated with the technique used to capture the motion information 154, such as +/−0.2 centimeters for a camera-based approach). In one embodiment, the interval manager 630 synchronizes the motion information 154 with the k-space data. The motion manager 620 then determines a motion of the subject between two points in time, based on the synchronized k-space data 152 and motion information 154. Further, the motion manager 620 determines a plurality of candidate motions 158 falling within the error margin 156 of the determined motion.

In one embodiment, the k-space modifier 640 changes one or more values of the k-space data 152 to produce modified k-space data 160 to compensate for motion occurring between two points in time (e.g., $t_1$ and $t_2$). For example, if three rows of the k-space data 152 were acquired during time $t_2$, the k-space modifier 640 may modify at least one element of the three rows. For instance, the k-space modifier may multiply an element by a complex number to change a phase or an amplitude of the component sinusoid represented by the element. The image generator 650 produces a graphical image 162. An example of the graphical image 162 is image 212 of FIG. 2. The evaluator 660 assesses one or more generated images 162 according to the criteria 164 (e.g., image sharpness) to produce an evaluation 168. The motion corrector 150 may determine to accept or reject candidate motions 158 based on the evaluation 168. For example, the motion corrector 150 may accept only the candidate motion 158 between times $t_1$ and $t_2$ resulting in the sharpest image 162. The motion corrector 150 may then proceed to compensate for a next motion (e.g., a motion between times $t_2$ and $t_3$) using the modified k-space data 160 associated with the sharpest image 162.

Figure 7:
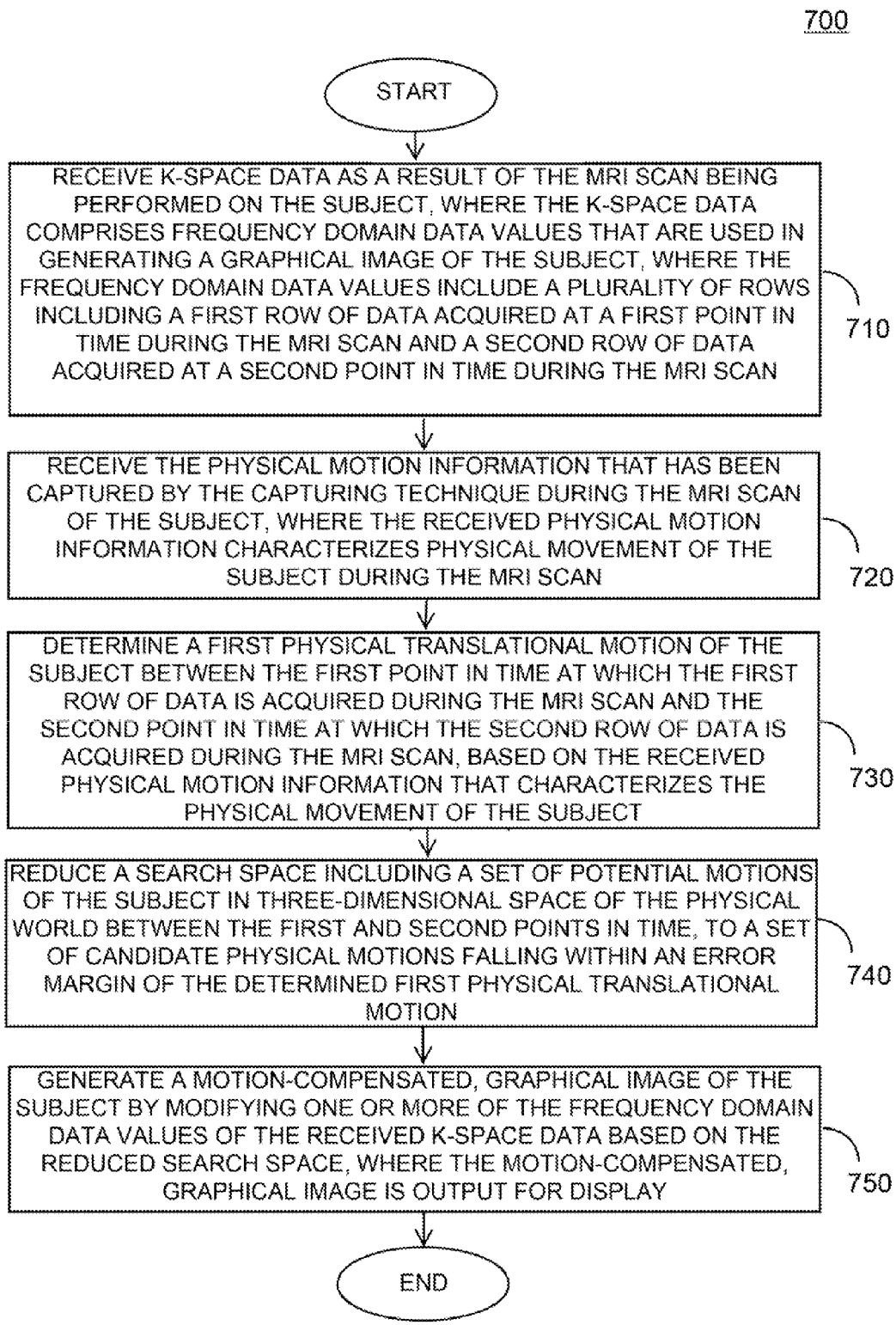
FIG. 7 is a flowchart depicting a method in order to compensate for physical motion of a subject during an MRI scan of the subject, according to one embodiment of the invention.

FIG. 7 is a flowchart depicting a method 700 in order to compensate for physical motion of a subject during an MRI scan of the subject, according to one embodiment of the invention. The physical motion is compensated for based on frequency domain modification and reduction of a search space, the search space itself including a set of potential physical motions of the subject in three-dimensional space of the physical world between a first point in time and a second point in time. The search space is reduced based on physical motion information that has been captured by a capturing technique during the MRI scan of the subject. As shown, the method 700 begins at step 710, where the motion corrector 150 receives k-space data as a result of the MRI scan being performed on the subject. The k-space data includes frequency domain data values that are used in generating a graphical image of the subject. The frequency domain data values include a plurality of rows including a first row of data acquired at the first point in time during the MRI scan and a second row of data acquired at the second point in time during the MRI scan.

At step 720, the motion corrector 150 receives the physical motion information that has been captured by the capturing technique during the MRI scan of the subject. The received physical motion information characterizes physical movement of the subject during the MRI scan. At step 730, the motion corrector 150 determines a first physical translational motion of the subject between the first point in time at which the first row of data is acquired during the MRI scan and the second point in time at which the second row of data is acquired during the MRI scan, based on the received physical motion information that characterizes the physical movement of the subject. At step 740, the motion corrector 150 reduces the search space to a set of candidate physical motions falling within an error margin of the determined first physical translational motion, the set of candidate physical motions being a subset of the set of potential physical motions of the subject. At step 750, the motion corrector 150 generates a motion-compensated, graphical image of the subject by modifying one or more of the frequency domain data values of the received k-space data based on the reduced search space, where the motion-compensated, graphical image is output for display. After the step 750, the method 700 terminates.

FIG. 8 depicts additional aspects 810 of physical motion compensation, according to one embodiment of the invention. As shown, the additional aspects 810 include an aspect that the search space, prior to being reduced, includes a set of all potentially occurring physical motions of the subject between the first point in time at which the first row of data is acquired during the MRI scan and the second point in time at which the second row of data is acquired during the MRI scan. Further, the search space, subsequent to being reduced, only includes the set of candidate physical motions falling within an error margin of the determined first physical translational motion, where the error margin is specific to the capturing technique, where at least one physical motion in the set of all potentially occurring physical motions is not included in the set of candidate physical motions. The plurality of rows of the k-space data further includes a third row of data acquired at a third point in time during the MRI scan. The first, second, and third points in time are distinct. The method further includes determining a second physical translational motion of the subject between the second and third points in time, based on the received physical motion information. The determined second physical translational motion is different from the determined first physical translational motion. At least the third row of the frequency domain data values of the k-space data is modified in order to compensate for the determined second physical translational motion. The third row of the frequency domain data values of the k-space data is modified differently than the second row of the frequency domain data values of the k-space data.

In one embodiment, the physical motion is compensated for by a motion correction application such as the motion corrector 150, where the motion correction application includes: (i) a k-space manager component; (ii) a motion manager component; (iii) an interval manager component; (iv) a k-space modifier component; (v) an image generator component; and (vi) an image evaluator component. The k-space manager component is configured to receive the k-space data from the MRI scan of the subject. The motion manager component is configured to: (i) receive the physical motion information captured by the capturing technique during the MRI scan of the subject and (ii) determine the first physical translational motion of the subject between the first and second points in time. The manager component is configured to synchronize the physical motion information and the k-space data.

FIG. 9 depicts additional aspects 910 of physical motion compensation, according to one embodiment of the invention. As shown, the additional aspects 910 include an aspect that the k-space modifier component is configured to multiply at least one data element in the k-space data by a complex number in order to alter at least one of a phase and an amplitude of the at least one data element. The image generator component is configured to generate graphical images based on the k-space data. The image evaluator component is configured to programmatically evaluate generated graphical images based on a set of predefined criteria, where the set of predefined criteria includes the predefined image sharpness criterion.

In one embodiment, modifying the received k-space data based on the reduced search space comprises, for each physical motion falling within the error margin of the determined first physical translational motion: (i) modifying at least the second row of the frequency domain data values of the k-space data in order to compensate for the respective physical motion; (ii) generating a candidate graphical image of the subject based on the modified k-space data; (iii) programmatically evaluating sharpness of the candidate graphical image based on the predefined image sharpness criterion; and (iv) determining whether to accept the modified k-space data based on the evaluation. In one embodiment, the modified k-space data is accepted for only one physical motion falling within the error margin of the determined first physical translational motion, the one physical motion having a corresponding candidate graphical image having a highest measure of sharpness among the candidate graphical images for the candidate motions. In one embodiment, only one modification is accepted for each of the first and second physical translational motions.

In one embodiment, modifying at least the second row of the frequency domain data values of the k-space data includes: (i) determining a corresponding change to a value in the k-space data in order to compensate for the respective physical motion, where the value is a phase of a sinusoid in the frequency domain representation; and (ii) modifying at least the second row of the frequency domain data values of the k-space data based on the determined change in order to shift an image corresponding to the first row of the frequency domain data values of the k-space data towards an image corresponding to the second row of the frequency domain data values of the k-space data.

FIG. 10 depicts additional aspects 1010 of physical motion compensation, according to one embodiment of the invention. As shown, the additional aspects 1010 include an aspect that generating a graphical image of the subject includes performing a two-dimensional fast Fourier transform on the k-space data, where the corresponding change is determined using the Fourier shift theorem, where modifying at least the second row of the frequency domain data values of the k-space data comprises multiplying a data element in the k-space data, comprising a first complex number, by a second complex number in order to alter at least one of a phase and an amplitude of the data element in the k-space data.

In one embodiment, the motion correction application is configured to reduce the search space for motion correction using each of a plurality of distinct capturing techniques including: (i) a camera-based approach; (ii) a periodically rotated overlapping parallel lines with enhanced reconstruction (PROPELLER) approach; and (iii) an optical-fiber-based approach. The camera-based approach is associated with a first error margin, the PROPELLER approach is associated with a second error margin, and the camera-based approach is associated with a third error margin. Each of the first, second, and third error margins is distinct. The motion correction application is configured to reduce the search space for motion correction using the respective error margin specific to each of the plurality of distinct capturing techniques.

Of course, the embodiments described herein are intended to be illustrative and not limiting of the invention, and other embodiments are broadly contemplated. Those skilled in the art will recognize, for example, that embodiments of the invention may be adapted to support other types of motion, data formats, and techniques for capturing motion information.

Advantageously, embodiments of the invention compensate for motion of a subject during an MRI scan of the subject. In one embodiment, a motion corrector may receive k-space data from the MRI scan of the subject. The k-space data may include a frequency domain data from which a graphical image of the subject may be generated. Further, the k-space data may include multiple sets of rows (of data), each corresponding to (i.e., acquired at) a particular point in time and a particular spatial position of a subject during the MRI scan. In addition, the motion corrector may receive motion information captured for the subject during the MRI scan and by a capturing technique. The motion corrector may determine a translational motion of the subject may be determined between the first point in time and the second point in time, based on the received motion information. The motion corrector may reduce the search space for motion correction using the determined change and an error margin of the capturing technique. The motion corrector may use the reduced search space to generate graphical images from the k-space data more efficiently and more accurately.

While the foregoing is directed to embodiments of the present invention, other and further embodiments of the invention may be devised without departing from the basic scope thereof, and the scope thereof is determined by the claims that follow.

What is claimed is:

1. A computer-implemented method in order to compensate for physical motion of a subject during a magnetic resonance imaging (MRI) scan of the subject, based on frequency domain modification and reduction of a search space, the search space itself including a set of potential physical motions of the subject in three-dimensional space of the physical world between a first point in time and a second point in time, the reduction of the search space being based on physical motion information that has been captured by a capturing technique during the MRI scan of the subject, the computer-implemented method comprising:

receiving, from a transmitting element and by operation of one or more computer processors of a system compatible with MRI, k-space data as a result of the MRI scan being performed on the subject, wherein the k-space data comprises frequency domain data values that are used in generating a graphical image of the subject, and wherein the frequency domain data values include a plurality of rows including:
- a first row of data acquired at the first point in time during the MRI scan and
- a second row of data acquired at the second point in time during the MRI scan;

receiving the physical motion information that has been captured by the capturing technique during the MRI scan of the subject, wherein the received physical motion information characterizes physical movement of the subject during the MRI scan;

determining a first physical translational motion of the subject between the first point in time at which the first row of data is acquired during the MRI scan and the second point in time at which the second row of data is acquired during the MRI scan, based on the received physical motion information that characterizes the physical movement of the subject;

programmatically reducing the search space to a set of candidate physical motions falling within a predefined error margin of the determined first physical translational motion, wherein the set of candidate physical motions is a subset of the set of potential physical motions; and generating a motion-compensated, graphical image of the subject by operation of the one or more computer processors and by modifying one or more of the frequency domain data values of the received k-space data based on the reduced search space, wherein the motion-compensated, graphical image is output for display.

2. The computer-implemented method of claim 1, wherein modifying one or more of the frequency domain data values of the received k-space data based on the reduced search space comprises, for each physical motion falling within the predefined error margin of the determined first physical translational motion:
- modifying at least the second row of the frequency domain data values of the k-space data in order to compensate for the respective physical motion and in order to generate modified k-space data;
- generating a graphical image of the subject based on the modified k-space data;
- programmatically evaluating sharpness of the generated graphical image based on a predefined image sharpness criterion; and
- determining whether to accept the modified k-space data based on the evaluation.

3. The computer-implemented method of claim 2, wherein modifying at least the second row of the frequency domain data values of the k-space data comprises:
- determining a corresponding change to a value in the k-space data in order to compensate for the respective physical motion, wherein the value is a phase of a sinusoid in the frequency domain representation; and
- modifying at least the second row of the frequency domain data values of the k-space data based on the determined change in order to shift an image corresponding to the first row of the frequency domain data values of the k-space data towards an image corresponding to the second row of the frequency domain data values of the k-space data.

4. The computer-implemented method of claim 2, wherein generating a graphical image of the subject comprises performing a two-dimensional fast Fourier transform on the k-space data.

5. The computer-implemented method of claim 3, wherein the corresponding change is determined using the Fourier shift theorem.

6. The computer-implemented method of claim 3, wherein modifying at least the second row of the frequency domain data values of the k-space data comprises multiplying a complex number of the k-space data by another complex number.

7. The computer-implemented method of claim 1, wherein the search space, prior to being reduced, includes a set of all potentially occurring motions of the subject between the first point in time at which the first row of data is acquired during the MRI scan and the second point in time at which the second row of data is acquired during the MRI scan, wherein the predefined error margin is specific to the capturing technique, and wherein at least one physical motion in the set of all potentially occurring physical motions is not included in the set of candidate physical motions.

8. The computer-implemented method of claim 7, wherein the plurality of rows of the k-space data further includes a third row of data acquired at a third point in time during the MRI scan, wherein the first point in time at which the first row of data is acquired during the MRI scan, the second point in time at which the second row of data is acquired during the MRI scan, and the third point in time at which the third row of data is acquired during the MRI scan are distinct, and wherein the method further comprises:
- determining a second physical translational motion of the subject between the second point in time at which the second row of data is acquired during the MRI scan and the third point in time at which the third row of data is acquired during the MRI scan, based on the received physical motion information, wherein the determined second physical translational motion is different from the determined first physical translational motion, wherein at least the third row of the frequency domain data values of the k-space data is modified in order to compensate for the determined second physical translational motion, wherein the third row of the frequency domain data values of the k-space data is modified differently than the second row of the frequency domain data values of the k-space data.

9. The computer-implemented method of claim 8, wherein the physical motion is compensated for by a motion correction application, wherein the motion correction application includes:
(i) a k-space manager;
(ii) a motion manager component;
(iii) an interval manager component;
(iv) a k-space modifier component;
(v) an image generator component; and
(vi) an image evaluator component;

wherein the k-space manager component is configured to receive the k-space data from the MRI scan of the subject;

wherein the motion manager component is configured to:
(i) receive the physical motion information captured by the capturing technique during the MRI scan of the subject and
(ii) determine the first physical translational motion of the subject between the first point in time at which the first row of data is acquired during the MRI scan and the second point in time at which the second row of data is acquired during the MRI scan;

wherein the interval manager component is configured to synchronize the physical motion information and the k-space data;

wherein the k-space modifier component is configured to multiply at least one data element in the k-space data by a complex number in order to alter at least one of a phase and an amplitude of the at least one data element;

wherein the image generator component is configured to generate graphical images based on the k-space data; and wherein the image evaluator component is configured to programmatically evaluate generated graphical images based on a set of predefined criteria, wherein the set of predefined criteria includes the predefined image sharpness criterion.

10. The computer-implemented method of claim 9, wherein modifying the received k-space data based on the reduced search space comprises, for each physical motion falling within the predefined error margin of the determined first physical translational motion:

modifying at least the second row of the frequency domain data values of the k-space data in order to compensate for the respective physical motion;

generating a candidate graphical image of the subject based on the modified k-space data;

programmatically evaluating sharpness of the candidate graphical image based on the predefined image sharpness criterion; and determining whether to accept the modified k-space data based on the evaluation; and wherein the modified k-space data is accepted for only one physical motion falling within the predefined error margin of the determined first physical translational motion, the one physical motion having a corresponding candidate graphical image having a highest measure of sharpness among the candidate graphical images for the candidate motions, and wherein only one modification is accepted for each of the determined first physical translational motion and the determined second physical translational motion.

11. The computer-implemented method of claim 10, wherein modifying at least the second row of the frequency domain data values of the k-space data comprises:

determining a corresponding change to a value in the k-space data in order to compensate for the respective physical motion, wherein the value is a phase of a sinusoid in the frequency domain representation; and modifying at least the second row of the frequency domain data values of the k-space data based on the determined change in order to shift an image corresponding to the first row of the frequency domain data values of the k-space data towards an image corresponding to the second row of the frequency domain data values of the k-space data; and wherein generating a graphical image of the subject comprises performing a two-dimensional fast Fourier transform on the k-space data, wherein the corresponding change is determined using the Fourier shift theorem, and wherein modifying at least the second row of the frequency domain data values of the k-space data comprises multiplying a data element in the k-space data, comprising a first complex number, by a second complex number in order to alter at least one of a phase and an amplitude of the data element in the k-space data.

12. The computer-implemented method of claim 11, wherein the motion correction application is configured to reduce the search space for motion correction using each of a plurality of distinct capturing techniques including:

(i) a camera-based approach;
(ii) a periodically rotated overlapping parallel lines with enhanced reconstruction (PROPELLER) approach; and
(iii) an optical-fiber-based approach;

wherein the camera-based approach is associated with a first predefined error margin, wherein the PROPELLER approach is associated with a second predefined error margin, wherein the camera-based approach is associated with a third predefined error margin, wherein each of the first predefined error margin, the second predefined error margin, and the third predefined error margin is distinct in magnitude, wherein the motion correction application is configured to reduce the search space for motion correction using the respective error margin specific to each of the plurality of distinct capturing techniques.

13. A non-transitory computer-readable medium containing a program which, when executed by operation of one or more computer processors of a system compatible with magnetic resonance imaging (MRI), performs an operation in order to compensate for physical motion of a subject during an MRI scan of the subject, based on frequency domain modification and reduction of a search space, the search space itself including a set of potential physical motions of the subject in three-dimensional space of the physical world between a first point in time and a second point in time, the reduction of the search space being based on physical motion information that has been captured by a capturing technique during the MRI scan of the subject, the operation comprising:

receiving k-space data as a result of the MRI scan being performed on the subject, wherein the k-space data comprises frequency domain data values that are used in generating a graphical image of the subject, and wherein the frequency domain data values include a plurality of rows including a first row of data acquired at the first point in time during the MRI scan and a second row of data acquired at the second point in time during the MRI scan;

receiving the physical motion information that has been captured by the capturing technique during the MRI scan of the subject, wherein the received physical motion information characterizes physical movement of the subject during the MRI scan;

determining a first physical translational motion of the subject between the first point in time at which the first row of data is acquired during the MRI scan and the second point in time at which the second row of data is acquired during the MRI scan, based on the received physical motion information that characterizes the physical movement of the subject;

programmatically reducing the search space to a set of candidate physical motions falling within a predefined error margin of the determined first physical translational motion, wherein the set of candidate physical motions is a subset of the set of potential physical motions; and generating a motion-compensated, graphical image of the subject by operation of the one or more computer processors when executing the program and by modifying one or more of the frequency domain data values of the received k-space data based on the reduced search space, wherein the motion-compensated, graphical image is output for display.

14. The non-transitory computer-readable medium of claim 13, wherein modifying one or more of the frequency domain data values of the received k-space data based on the reduced search space comprises, for each physical motion falling within the predefined error margin of the determined first physical translational motion:
  modifying at least the second row of the frequency domain data values of the k-space data in order to compensate for the respective physical motion and in order to generate modified k-space data;
  generating a graphical image of the subject based on the modified k-space data;
  programmatically evaluating sharpness of the generated graphical image based on a predefined image sharpness criterion; and
  determining whether to accept the modified k-space data based on the evaluation.

15. The non-transitory computer-readable medium of claim 14, wherein modifying at least the second row of the frequency domain data values of the k-space data comprises:
  determining a corresponding change to a value in the k-space data in order to compensate for the respective physical motion, wherein the value is a phase of a sinusoid in the frequency domain representation; and
  modifying at least the second row of the frequency domain data values of the k-space data based on the determined change in order to shift an image corresponding to the first row of the frequency domain data values of the k-space data towards an image corresponding to the second row of the frequency domain data values of the k-space data.

16. The non-transitory computer-readable medium of claim 14, wherein generating a graphical image of the subject comprises performing a two-dimensional fast Fourier transform on the k-space data.

17. The non-transitory computer-readable medium of claim 15, wherein the corresponding change is determined using the Fourier shift theorem.

18. The non-transitory computer-readable medium of claim 15, wherein modifying at least the second row of the frequency domain data values of the k-space data comprises multiplying a complex number of the k-space data by another complex number.

19. A system, compatible with magnetic resonance imaging (MRI), that compensates for physical motion of a subject during an MRI scan of the subject, based on frequency domain modification and reduction of a search space, the search space itself including a set of potential physical motions of the subject in three-dimensional space of the physical world between a first point in time and a second point in time, the reduction of the search space being based on physical motion information that has been captured by a capturing technique during the MRI scan of the subject, the system comprising:
  a processor; and
  a memory containing a program, which when executed by the processor is configured to perform an operation comprising:
    receiving k-space data as a result of the MRI scan being performed on the subject, wherein the k-space data comprises frequency domain data values that are used in generating a graphical image of the subject, and wherein the frequency domain data values include a plurality of rows including a first row of data acquired at the first point in time during the MRI scan and a second row of data acquired at the second point in time during the MRI scan;
    receiving the physical motion information that has been captured by the capturing technique during the MRI scan of the subject, wherein the received physical motion information characterizes physical movement of the subject during the MRI scan;
    determining a first physical translational motion of the subject between the first point in time at which the first row of data is acquired during the MRI scan and the second point in time at which the second row of data is acquired during the MRI scan, based on the received physical motion information that characterizes the physical movement of the subject;
    programmatically reducing the search space to a set of candidate physical motions falling within a predefined error margin of the determined first physical translational motion, wherein the set of candidate physical motions is a subset of the set of potential physical motions; and
    generating a motion-compensated, graphical image of the subject by modifying one or more of the frequency domain data values of the received k-space data based on the reduced search space, wherein the motion-compensated, graphical image is output for display.

20. The system of claim 19, wherein modifying one or more of the frequency domain data values of the received k-space data based on the reduced search space comprises, for each physical motion falling within the predefined error margin of the determined first physical translational motion:
  modifying at least the second row of the frequency domain data values of the k-space data in order to compensate for the respective physical motion and in order to generate modified k-space data;
  generating a graphical image of the subject based on the modified k-space data;
  programmatically evaluating sharpness of the generated graphical image based on a predefined image sharpness criterion; and
  determining whether to accept the modified k-space data based on the evaluation.

21. The system of claim 20, wherein modifying at least the second row of the frequency domain data values of the k-space data comprises:
  determining a corresponding change to a value in the k-space data in order to compensate for the respective physical motion, wherein the value is a phase of a sinusoid in the frequency domain representation; and
  modifying at least the second row of the frequency domain data values of the k-space data based on the determined change in order to shift an image corresponding to the first row of the frequency domain data values of the k-space data towards an image corresponding to the second row of the frequency domain data values of the k-space data.

22. The system of claim 20, wherein generating a graphical image of the subject comprises performing a two-dimensional fast Fourier transform on the k-space data.

23. The system of claim 21, wherein the corresponding change is determined using the Fourier shift theorem.

24. The system of claim 21, wherein modifying at least the second row of the frequency domain data values of the k-space data comprises multiplying a complex number of the k-space data by another complex number.

* * * * *